(12) United States Patent
Zhang

(10) Patent No.: US 10,311,779 B2
(45) Date of Patent: Jun. 4, 2019

(54) ARRAY SUBSTRATE, LIQUID CRYSTAL DISPLAY PANEL AND ORGANIC LIGHT EMITTING DISPLAY PANEL

(71) Applicants: Xiamen Tianma Micro-Electronics Co., Ltd., Xiamen (CN); Tianma Micro-Electronics Co., Ltd., Shenzhen (CN)

(72) Inventor: Lei Zhang, Xiamen (CN)

(73) Assignees: XIAMEN TIANMA MICRO-ELECTRONICS CO., LTD., Xiang'an District, Xiamen (CN); TIANMA MICRO-ELECTRONICS CO., LTD., Futian District, Shenzhen (CN)

( * ) Notice: Subject to any disclaimer, the term of this patent is extended or adjusted under 35 U.S.C. 154(b) by 468 days.

(21) Appl. No.: 14/963,206

(22) Filed: Dec. 8, 2015

(65) Prior Publication Data

US 2016/0189607 A1   Jun. 30, 2016

(30) Foreign Application Priority Data

Dec. 29, 2014   (CN) .......................... 2014 1 0844740

(51) Int. Cl.
*G09G 3/36* (2006.01)
*G09G 3/3225* (2016.01)
(Continued)

(52) U.S. Cl.
CPC ....... *G09G 3/3225* (2013.01); *G02F 1/13306* (2013.01); *G02F 1/13454* (2013.01);
(Continued)

(58) Field of Classification Search
CPC .. G09G 3/3225; G09G 3/3208; G09G 3/3611; G09G 3/3666; G09G 2310/0224;
(Continued)

(56) References Cited

U.S. PATENT DOCUMENTS

2006/0055864 A1* 3/2006 Matsumura ........... G02F 1/1362
349/187
2008/0316156 A1* 12/2008 Shigaki ................ G09G 3/3674
345/87
(Continued)

FOREIGN PATENT DOCUMENTS

CN        103268032 A        8/2013
CN        103730093 A        4/2014
(Continued)

*Primary Examiner* — Lunyi Lao
*Assistant Examiner* — Jarurat Suteerawongsa
(74) *Attorney, Agent, or Firm* — Faegre Baker Daniels LLP

(57) ABSTRACT

An array substrate, a liquid crystal display panel and an organic light emitting display panel are disclosed. The array substrate includes: a plurality of pixel units arranged in a plurality of rows and a plurality of columns and divided into a plurality of pixel unit groups each including n rows of pixel units, where n is equal to or larger than 1; and at least one driving circuit each disposed on a side of the pixel unit group in a row direction, where the at least one driving circuit interleaves with neighboring preceding and succeeding pixel unit groups in a column direction of the plurality of pixel units.

11 Claims, 13 Drawing Sheets

(51) Int. Cl.
  *G02F 1/133*    (2006.01)
  *H01L 27/32*    (2006.01)
  *G09G 3/3208*   (2016.01)
  *G02F 1/1345*   (2006.01)
  *G02F 1/1333*   (2006.01)

(52) U.S. Cl.
  CPC ......... *G09G 3/3208* (2013.01); *G09G 3/3611* (2013.01); *G09G 3/3666* (2013.01); *H01L 27/3288* (2013.01); *G02F 2001/133388* (2013.01); *G09G 2310/0224* (2013.01); *G09G 2310/0281* (2013.01); *G09G 2310/0286* (2013.01); *G09G 2310/08* (2013.01); *H01L 27/3237* (2013.01)

(58) Field of Classification Search
  CPC ... G09G 2310/0281; G09G 2310/0286; G09G 2310/08; G09G 3/36; G02F 1/13306; G02F 1/13454; G02F 2001/133388; H01L 27/3288; H01L 27/3237
  See application file for complete search history.

(56) References Cited

U.S. PATENT DOCUMENTS

| | | | |
|---|---|---|---|
| 2010/0265224 A1* | 10/2010 | Cok | G09G 3/3266 345/206 |
| 2012/0206421 A1* | 8/2012 | Cok | G09G 3/2085 345/204 |
| 2015/0310801 A1* | 10/2015 | Lin | G09G 3/3225 345/205 |

FOREIGN PATENT DOCUMENTS

| | | |
|---|---|---|
| CN | 103956131 A | 7/2014 |
| CN | 104238214 A | 12/2014 |

\* cited by examiner

ARRAY SUBSTRATE, LIQUID CRYSTAL DISPLAY PANEL AND ORGANIC LIGHT EMITTING DISPLAY PANEL

CROSS-REFERENCE TO RELATED APPLICATION

This application claims priority to Chinese Application No. 201410844740.3, filed Dec. 29, 2014, which is herein incorporated by reference in its entirety.

TECHNICAL FIELD

The present disclosure relates to the field of display technologies and, in particular, to an array substrate, a liquid crystal display panel, and an organic light emitting display panel.

BACKGROUND

In the field of display technologies, the most popular display technologies include a liquid crystal display technology and an organic light emitting diode display technology. A display panel is an important part for both of these two display technologies.

FIG. 1 is a schematic top view of a display panel in the related art. As shown in FIG. 1, a common display panel is divided into a display area 1 and a peripheral circuit area 2 surrounding the display area 1. Display panels for the two display technologies each include an array substrate, where a plurality of pixel units are arranged in the display area 1 of the array substrate, while corresponding driving circuits are arranged in the peripheral circuit area 2 of the array substrate to drive each of the pixel units.

The peripheral circuit area in which the driving circuits are located is a nonluminous area which forms a frame of the display panel, and a size of the frame of the display panel is determined by the size of the driving circuits. With increasing requirements of users for the display technology, a need for a frameless display also grows. However, this need cannot be satisfied because of the impact of the driving circuits in the related art.

SUMMARY

In view of this, embodiments of the disclosure provide an array substrate, a liquid crystal display panel, and an organic light emitting display panel.

An aspect of embodiments of the disclosure provide an array substrate, including:
- a plurality of pixel units arranged in a plurality of rows and a plurality of columns and divided into a plurality of pixel unit groups each including n rows of pixel units, where n is equal to or larger than 1; and
- at least one driving circuit each disposed on a side of the pixel unit group in a row direction;
- where the at least one driving circuit interleaves with neighboring preceding and succeeding pixel unit groups in a column direction of the plurality of pixel units.

Another aspect of embodiments of the disclosure provide a liquid crystal display panel, including the above-described array substrate.

Yet another aspect of embodiments of the disclosure provide an organic light emitting display panel, including the above-described array substrate.

In technical solutions provided in the disclosure, an array substrate includes a plurality of pixel units arranged in a plurality of rows and a plurality of columns and divided into a plurality of pixel unit groups each including n rows of pixel units, where n is equal to or larger than 1. Moreover, a driving circuit is disposed for each pixel unit group on a side of the pixel unit group in the row direction, and the driving circuit interleaves with neighboring preceding and succeeding pixel unit groups in a column direction of the pixel units. Accordingly, the driving circuits are hidden among the pixel units through interleaving of the driving circuits with the neighboring preceding and succeeding pixel units in the column direction of the pixel units on the array substrate, that is, the display area interlaces with the peripheral circuit area, instead of separately disposing the driving circuits outside the display area formed by the pixel units. As such, displaying is performed on the entire area of the display panel during operation to achieve a frameless display effect.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

The above and other features and advantages of the disclosure will become apparent from the detailed description of non-limiting embodiments given below with reference to the accompany drawings, in which.

Figure 1:
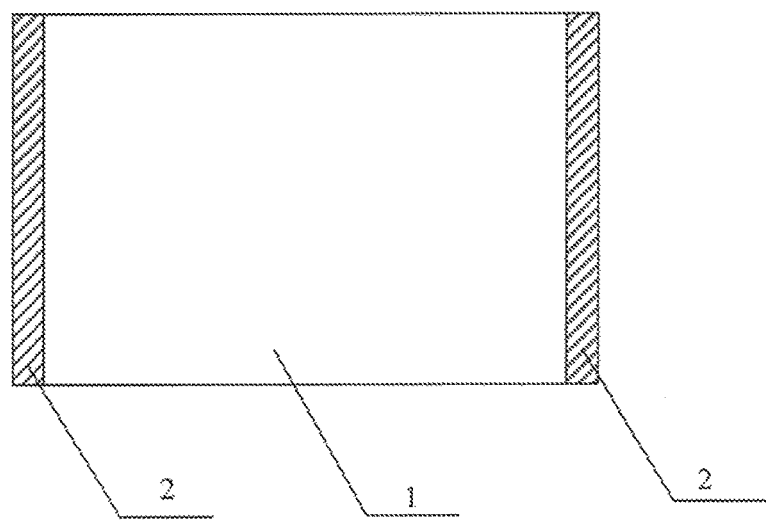
FIG. 1 is a schematic top view of a display panel in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be further described in detail in conjunction with the accompanying drawings and the embodiments of the disclosure. It can be understood that the embodiments described here are not intended to limit the scope of the disclosure but intended to explain the disclosure, and embodiments described here show merely a portion of but not all of the embodiments of the disclosure.

The following technical solutions are proposed to avoid a frame surrounding a display panel in the related art, to solve the problem of a frameless display panel.

Figure 2:
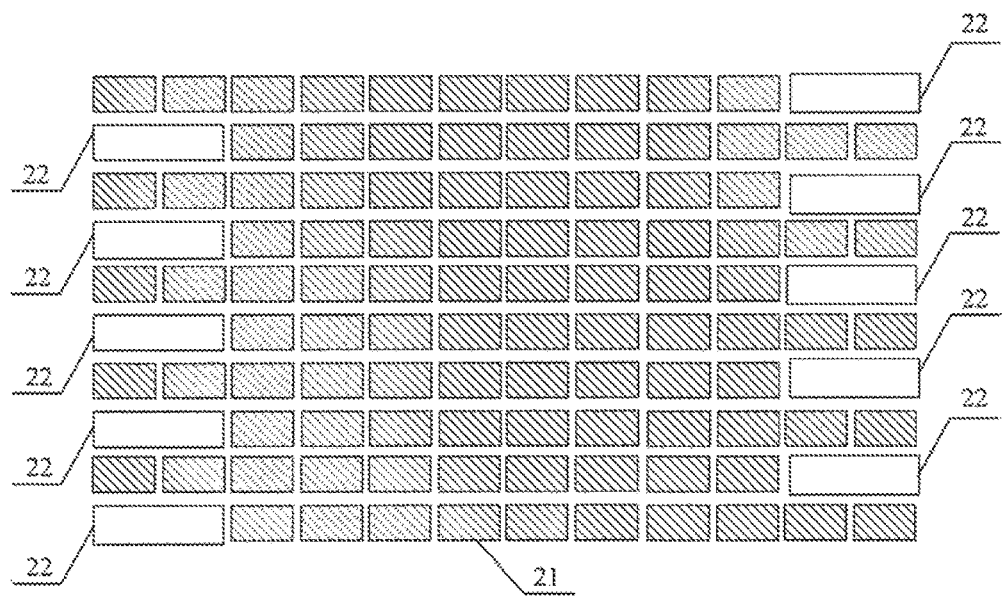
FIG. 2 is a schematic top view of a first array substrate, according to embodiments of the disclosure.

FIG. 2 is a schematic top view of a first array substrate, according to embodiments of the disclosure. As shown in FIG. 2, the array substrate includes a plurality of pixel units 21 arranged in a plurality of rows and a plurality of columns, and the plurality of pixel units 21 are divided into a plurality of pixel unit groups each including n rows of pixel units, where n is larger than or equal to 1, and n is equal to 1 in the embodiments shown in FIG. 2. The array substrate further includes at least one driving circuit 22 each disposed on a left side or a right side of the pixel unit group in the row direction. The driving circuits 22 interleave with neighboring preceding and succeeding pixel unit groups thereof in a column direction of the plurality of pixel units 21.

Figure 3:
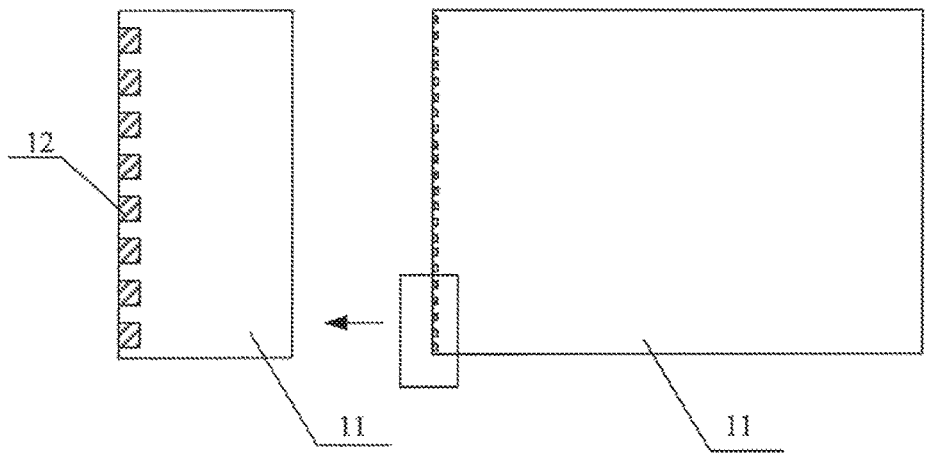
FIG. 3 is a schematic view of a display effect of the display panel shown in FIG. 2.

The interleaving arrangement in embodiments of the disclosure refers to that: on the basis of arranging the pixel units in rows and grouping a plurality of rows of the pixel units into a pixel unit group, one or more of the rows of pixel units in each pixel unit group are extended to a frame area, and an area for disposing a driving circuit is reserved at a left or right side (in a row direction) of an unextended row of the pixel units in the pixel unit group, so that the driving circuit is hidden among the pixel units, as such, on a left side edge or a right side edge of the display area constituted by the pixel units, the peripheral circuit area including the driving circuits and the display area are presented alternately, instead of separately disposing the peripheral circuit area outside the display area constituted by the pixel units. That is, the display area interlaces with the peripheral circuit area in which the driving circuits are disposed, as a result, displaying on the entire area of the display panel in operation is possible, to achieve a frameless display effect. FIG. 3 is a schematic view of a display effect of the display panel shown in FIG. 2. As shown in FIG. 3, on a left side edge of the display area 11, the peripheral circuit area 12 constituted by driving circuits are presented alternately with the display area 11. With the increase of a resolution of the display panel, a display effect difference at the left side becomes less and less significant until unidentifiable by human's eyes, thereby achieving a frameless display panel.

FIG. 2 shows a case in which each pixel unit group is constituted by one row of pixel units. Additionally, other cases in which each pixel unit group is constituted by two, three or more rows of pixel units will be further described below in subsequent embodiments of the disclosure.

In embodiments of the disclosure, each row of pixel units is driven by a driving circuit. The driving circuit may include n cascaded shift register units each configured to drive one row of pixel units. That is, the shift register units correspond to the rows of pixel units in a one-to-one corresponding relation. If each pixel unit group includes n rows of pixel units, n cascaded shift register units are included in the driving circuit and configured to successively drive the n rows of pixel units in a preset sequence.

A technical solution in which each row of pixel units is provided with a corresponding shift register unit can be implemented in two manners. A first one of the two implementation manners is to arrange a corresponding shift register unit at one side of each row of pixel units within the pixel unit group, in this case, shift register units for neighboring pixel unit groups are required to be disposed at different sides to achieve the interleaving arrangement of the driving circuits with the neighboring preceding and succeeding pixel unit groups. This first implementation manner is suitable for cases in which each pixel unit group includes one, two, three or more rows of pixel units, that is, n=1, 2, 3, and so on. A second one of the two implementation manners is to arrange shift register units corresponding to the respective rows of pixel units in each pixel unit group at one side of one of the rows of pixel units within the pixel unit group, in this case, the shift register units for neighboring pixel unit groups may be disposed either at the same side or at different sides to achieve the interleaving arrangement of the driving circuits with the neighboring preceding and succeeding pixel unit groups. This second implementation manner is suitable for cases in which each pixel unit group includes two or more rows of pixel units, that is, n=2, 3, and so on. For the case in which n>3, the shift register unit may be disposed at a row of pixel units other than the first and last rows of pixel units.

It should be noted that, in FIGS. 4A to 7D illustrating subsequent embodiments of the disclosure, for ease of description, a plurality of pixel units 21 at the same row are not identified individually. However, it can be understood by those skilled in the art that the pixel units in each row may include a plurality of individual pixel units 21.

Figure 4A:
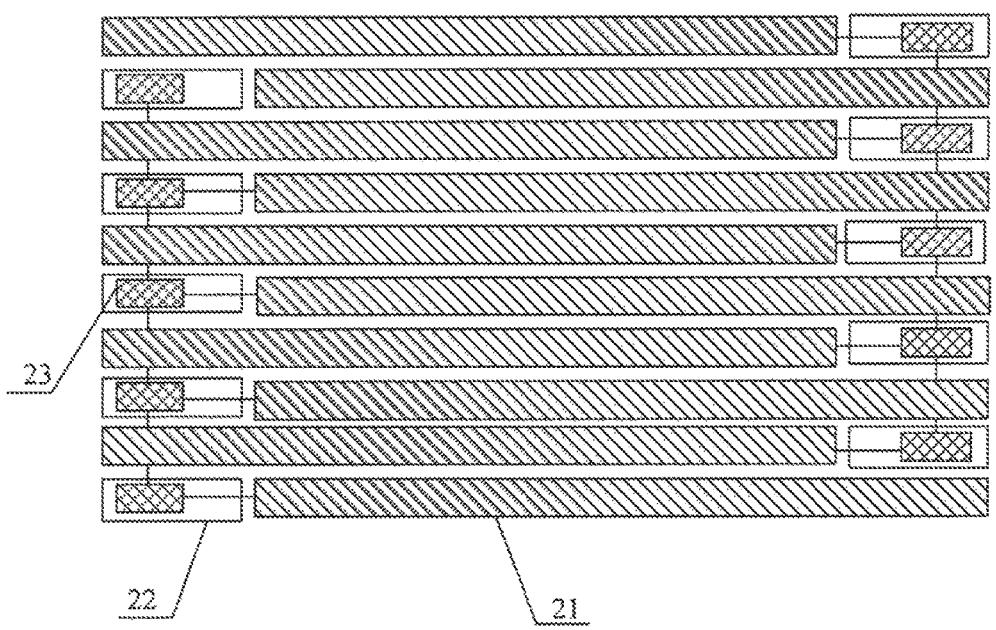
FIG. 4A is a schematic top view of an array substrate where n equals 1, according to embodiments of the disclosure.

For the above first implementation manner, FIG. 4A is a schematic top view of an array substrate where n equals 1, according to embodiments of the disclosure. As shown in FIG. 4A, in embodiments, each pixel unit group includes one row of pixel units 21, and accordingly each driving circuit 22 includes one shift register unit 23. Thus, a corresponding shift register unit 23 is disposed at one side of each row of pixel units 21, and shift register units 23 for any two neighboring rows of pixel units are disposed at different sides. Meanwhile, in embodiments, the shift register units 23 at the same side can be cascaded in sequence in a column direction, to form two columns of shift register units 23 disposed on a left side and a right side of the pixel units 21, respectively. In operation, the shift register units successively control the respective rows of pixel units in sequence according to a time sequence control signal.

Figure 4B:
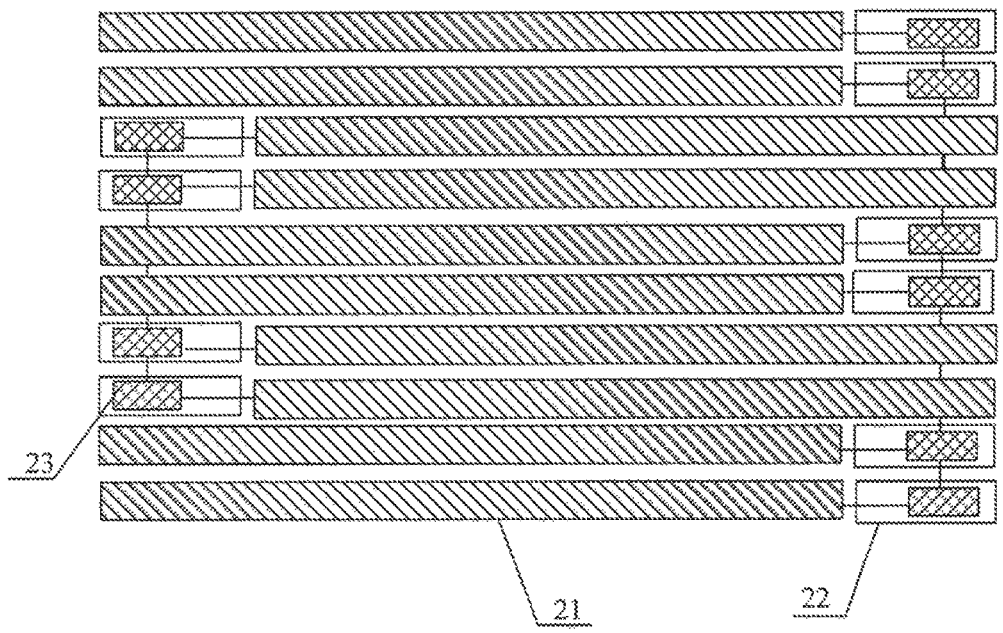
FIG. 4B is a schematic top view of the first array substrate where n equals 2, according to embodiments of the disclosure.

FIG. 4B is a schematic top view of the first array substrate where n equals 2, according to embodiments of the disclosure. As shown in FIG. 4B, in embodiments, each pixel unit group includes two rows of pixel units 21, and accordingly each driving circuit 22 includes two shift register units 23. In embodiments, a corresponding shift register unit 23 is disposed at one side of each row of pixel units 21 within each pixel unit group, and shift register units 23 for neighboring pixel unit groups are disposed at different sides, that is, the shift register units 23 for a pixel unit group are disposed at a side, while the shift register units 23 for a neighboring pixel unit group are disposed at the opposite side. Meanwhile, in embodiments, the shift register units 23 at the same side can be cascaded in sequence in the column direction, to form two columns of shift register units 23 disposed on a left side and a right side of the pixel units 21, respectively. The shift register unit 23 for the first row of pixel units within each pixel unit group is connected to a shift register unit 23 for the second row of pixel units within the second preceding pixel unit group, if any, and the shift register unit 23 for the second row of pixel units within said each pixel unit group is connected to a shift register unit 23 for the first row of pixel units within the second succeeding pixel unit group, if any. In operation, the shift register units successively control the respective rows of pixel units in sequence according to a time sequence control signal.

Figure 4C:
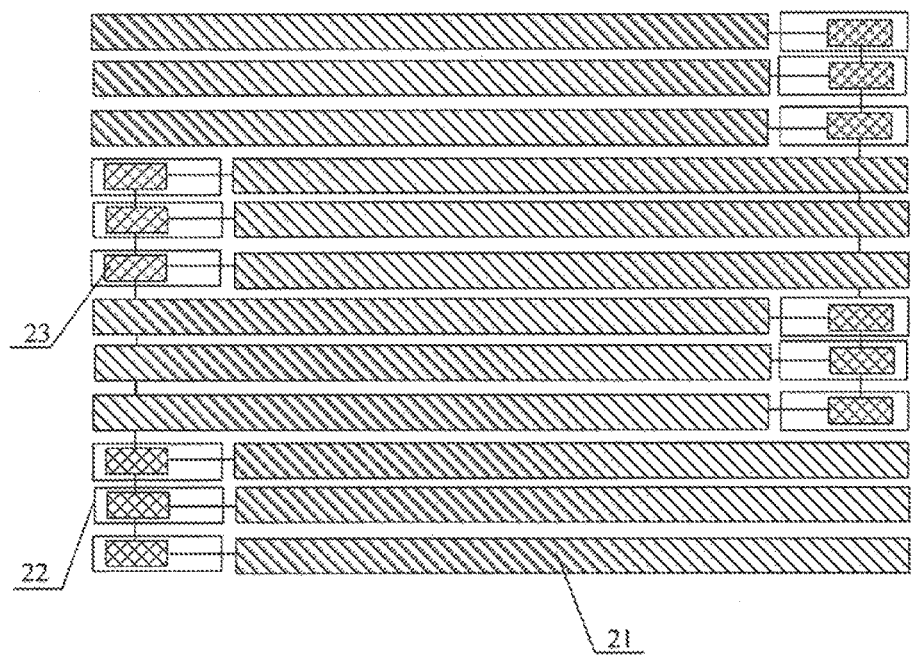
FIG. 4C is a schematic top view of the first array substrate where n equals 3, according to embodiments of the disclosure.

FIG. 4C is a schematic top view of the first array substrate where n equals 3, according to embodiments of the disclosure. As shown in FIG. 4C, in embodiments, each pixel unit group includes three rows of pixel units 21, and accordingly each driving circuit 22 includes three shift register units 23. In embodiments, a corresponding shift register unit 23 is disposed at one side of each row of pixel units 21 within each pixel unit group, and shift register units 23 for neighboring pixel unit groups are disposed at different sides. Meanwhile, in embodiments, the shift register units 23 at the same side can be cascaded in sequence in the column direction, to form two columns of shift register units 23 disposed on the left side and the right side of the pixel units 21, respectively. The shift register unit 23 for the first row of pixel units within each pixel unit group is connected to a shift register unit 23 for the third row of pixel units within the second preceding pixel unit group, if any, and the shift register unit 23 for the third row of pixel units within said each pixel unit is connected to a shift register unit 23 for the first row of pixel units in the second succeeding pixel unit group, if any. In operation, the shift register units successively control the respective rows of pixel units in sequence according to a time sequence control signal.

Figure 5A:
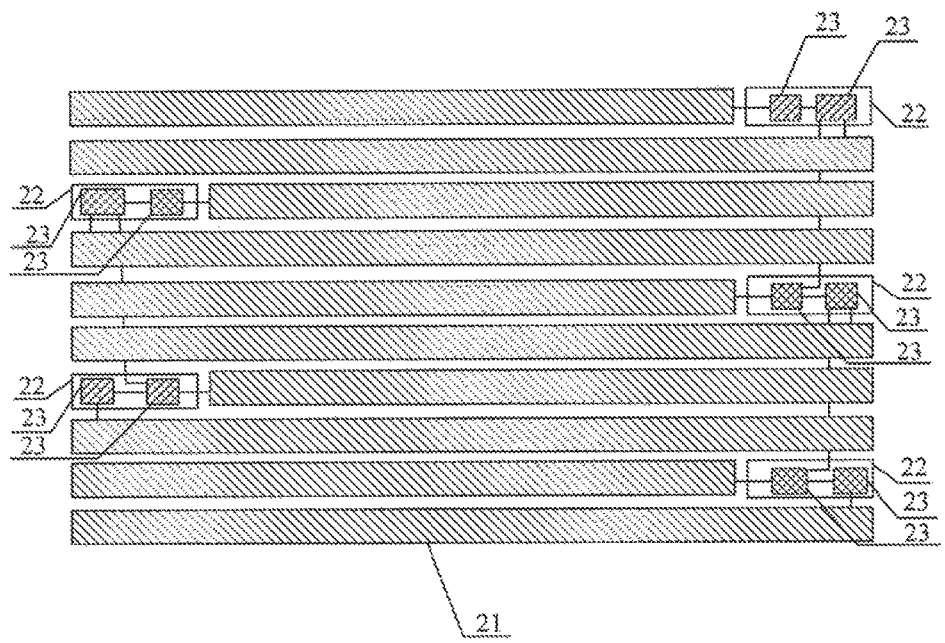
FIG. 5A is a schematic top view of a second array substrate where n equals 2, according to embodiments of the disclosure.

For the above second implementation manner, FIG. 5A is a schematic top view of a second array substrate where n equals 2, according to embodiments of the disclosure. As shown in FIG. 5A, in embodiments, each pixel unit group includes two rows of pixel units 21, and accordingly each driving circuit 22 includes two shift register units 23. In embodiments, the two shift register units 23 are both disposed at one side of the first row of pixel units within each pixel unit group, and the shift register units 23 for neighboring pixel unit groups are disposed at different sides of the pixel units 21. Meanwhile, in embodiments, the shift register units 23 at the same side can be cascaded in sequence in the column direction to form two columns of shift register units 23 disposed on the left side and the right side of the pixel units 21, respectively. The shift register unit 23 for the first row of pixel units within each pixel unit group is connected to a shift register unit 23 for the second row of pixel units in the second preceding pixel unit group, if any, and the shift register unit 23 for the second row of pixel units within said each pixel unit group is connected to a shift register unit 23 for the first row of pixel units in the second succeeding pixel unit group, if any. In operation, the shift register units successively control the respective rows of pixel units in sequence according to a time sequence control signal. As shown in FIG. 5A, both the two shift register units are disposed at one side of the first row of pixel units in the pixel unit group, or alternatively, in some embodiments, both the two shift register units can be disposed at one side of the second row of pixel units in the pixel unit group.

Figure 5B:
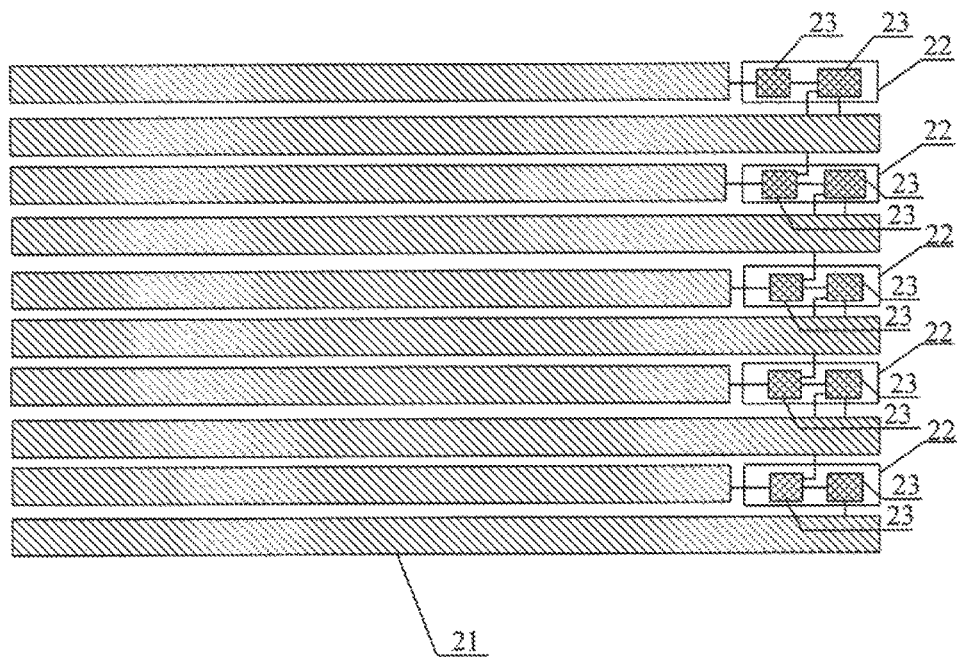
FIG. 5B is a schematic top view of a third array substrate where n equals 2, according to embodiments of the disclosure.

FIG. 5B is a schematic top view of a third array substrate where n equals 2, according to embodiments of the disclosure. These embodiments are different from the embodiments of FIG. 5A in that the shift register units 23 for neighboring pixel unit groups are disposed at the same side, where an interleaving arrangement of the driving circuits with the pixel unit groups is likewise achieved. The shift register units 23 at the same side are cascaded in sequence in the column direction to form one column of shift register units 23 on the right side of pixel units 21, that is, the shift register unit 23 for the first row of pixel units within each pixel unit group is connected to a shift register unit 23 for the second row of pixel units in the immediately preceding pixel unit group, if any, and the shift register unit 23 for the second row of pixel units 21 within said each pixel unit group is connected to a shift register unit 23 for the first row of pixel units in the immediately succeeding pixel unit group, if any. In operation, the shift register units successively controls the respective rows of pixel units in sequence according to a time sequence control signal. As shown in FIG. 5B, both of the two shift register units within each pixel group are disposed at one side of the first row of pixel units in the pixel unit group, or alternatively, in some embodiments, both of the two shift register units can be disposed at one side of the second row of pixel units in the pixel unit group. Although the shift register units are shown in FIG. 5B to be disposed at the right side, the shift register units can be disposed alternatively at the left side.

Figure 5C:
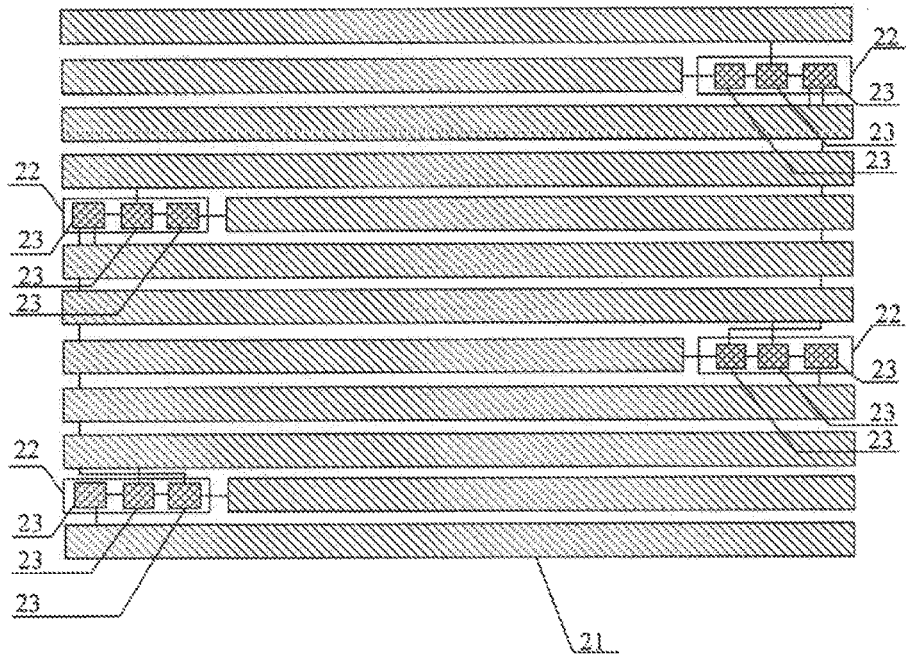
FIG. 5C is a schematic top view of the second array substrate where n equals 3, according to embodiments of the disclosure.

FIG. 5C is a schematic top view of the second array substrate where n equals 3, according to embodiments of the disclosure. As shown in FIG. 5C, in embodiments, each pixel unit group includes three rows of pixel units 21, and accordingly each driving circuit 22 includes three shift register units 23. In embodiments, the three shift register units in each pixel unit group are all disposed at one side of one row of pixel units within the pixel unit group, and the shift register units 23 for neighboring pixel unit groups are disposed at different sides. Meanwhile, in embodiments, the shift register units 23 at the same side can be cascaded in sequence in the column direction to form two columns of shift register units 23 disposed on the left side and the right side of pixel units 21, respectively. The shift register unit 23 for the second row of pixel units within each pixel unit group is connected to a shift register unit 23 for the third row of pixel units in the second preceding pixel unit group, and the shift register unit 23 for the third row of pixel units within said each pixel unit group is connected to a shift register unit 23 for the second row of pixel units in the second succeeding pixel unit group. In operation, the shift register units successively control the respective rows of pixel units in sequence according to a time sequence control signal. As shown in FIG. 5C, all the three shift register units are disposed at one side of the second row of pixel units in each pixel unit group. In some embodiments, all three shift register units in each pixel unit group can be disposed at one side of the first or third row of pixel units in the pixel unit group.

Figure 5D:
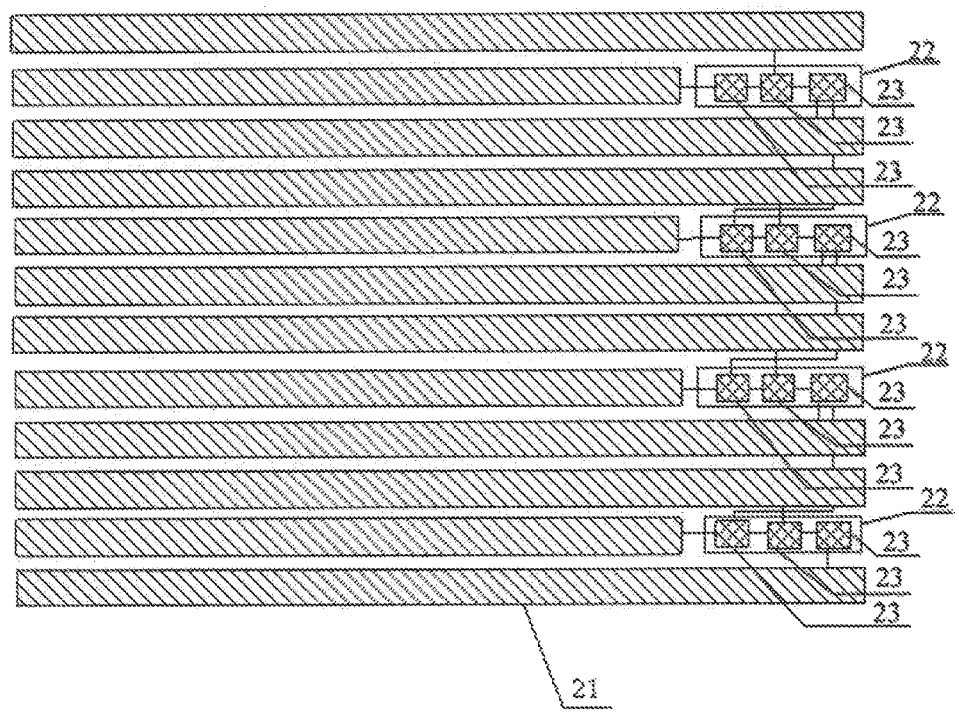
FIG. 5D is a schematic top view of the third array substrate where n equals 3, according to embodiments of the disclosure.

FIG. 5D is a schematic top view of the third array substrate where n equals 3, according to embodiments of the disclosure. As shown in FIG. 5D, in embodiments, the shift register units 23 for neighboring pixel unit groups are disposed at the same side, and an interleaving arrangement of the driving circuits with the pixel unit groups is achieved as well. Moreover, the shift register units 23 at the same side can be cascaded in sequence in the column direction, to form one column of shift register units 23 disposed on the right side of the pixel units 21, that is, the shift register unit 23 for the second row of pixel units 21 within each pixel unit group is connected to a shift register unit 23 for the third row of pixel units in the immediately preceding pixel unit group, if any, and the shift register unit 23 for the third row of pixel units 21 within said each pixel unit group is connected to the shift register unit 23 for the second row of pixel units in the immediately succeeding pixel unit group, if any. In operation, the shift register units successively control the respective rows of pixel units in sequence according to a time sequence control signal. As shown in FIG. 5D, all the three shift register units within each pixel group are disposed at one side of the second row of pixel units in the pixel unit group. In some embodiments, all three shift register units within each pixel group can be disposed at one side of the first or third row of pixel units in the pixel unit group. Although the shift register units are shown in FIG. 5D to be disposed at the right side, the shift register units can be disposed alternatively at the left side.

Unlike the above-described solution in which each row of pixel units are provided with a corresponding shift register unit, embodiments of the disclosure also provide another technical solution of a driving circuit, where the driving circuit includes one shift register unit and a controlling unit (e.g. a multipath controlling unit or one-to-multiple controlling unit), each row of pixel units within the pixel unit group is connected to the shift register unit via the controlling unit. This implementation manner of the driving circuit is suitable for the case in which each pixel unit group includes two or more rows of pixel units, that is, n is equal to or larger than 2.

The technical solution in which each pixel unit group is provided with a shift register unit through the controlling unit can be implemented in two manners. A first one of the two implementation manners is to provide the driving circuit at one side of each row of pixel units within each pixel unit group, where the driving circuits for neighboring pixel unit groups are disposed at different sides. A second one of the two implementation manners is to provide the driving circuit at one side of one row of pixel units within each pixel unit group, where the driving circuits for neighboring pixel unit groups are disposed at the same side or different sides.

Figure 6A:
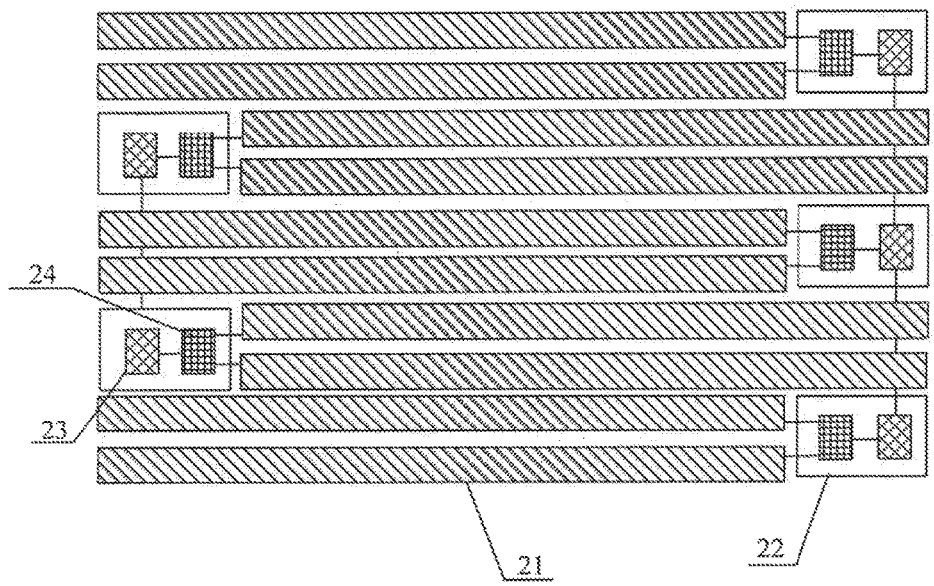
FIG. 6A is a schematic top view of a fourth array substrate where n equals 2, according to embodiments of the disclosure.

For the first implementation manner, FIG. 6A is a schematic top view of a fourth array substrate where n equals 2, according to embodiments of the disclosure. As shown in FIG. 6A, in embodiments, each pixel unit group includes two rows of pixel units 21. In embodiments, the driving circuit 22 includes one shift register unit 23 and a controlling unit (e.g. a multipath controlling unit or one-to-multiple controlling unit) 24, which are disposed at the same side of the two rows of pixel units 21 in the pixel unit group. The driving circuits for neighboring pixel unit groups are disposed at different sides. In embodiments, the shift register units 23 at the same side can be cascaded in sequence in the column direction to form two columns of shift register units 23 disposed on the left side and the right side of the pixel units 21, respectively. Each shift register unit is connected to a shift register unit in a driving circuit corresponding to the second preceding pixel unit group, if any, and connected to a shift register unit in a driving circuit corresponding to the second succeeding pixel unit group, if any. In operation, the cascaded shift register units receive driving signals in sequence according to a time sequence control signal. Within each pixel unit group, the shift register unit is configured to apply the driving signal to each row of pixel units in the pixel unit group simultaneously through the controlling unit, or alternatively, in some embodiments, apply the driving signal to each row of pixel units in the pixel unit group in sequence in the column direction in a time-division manner.

Figure 6B:
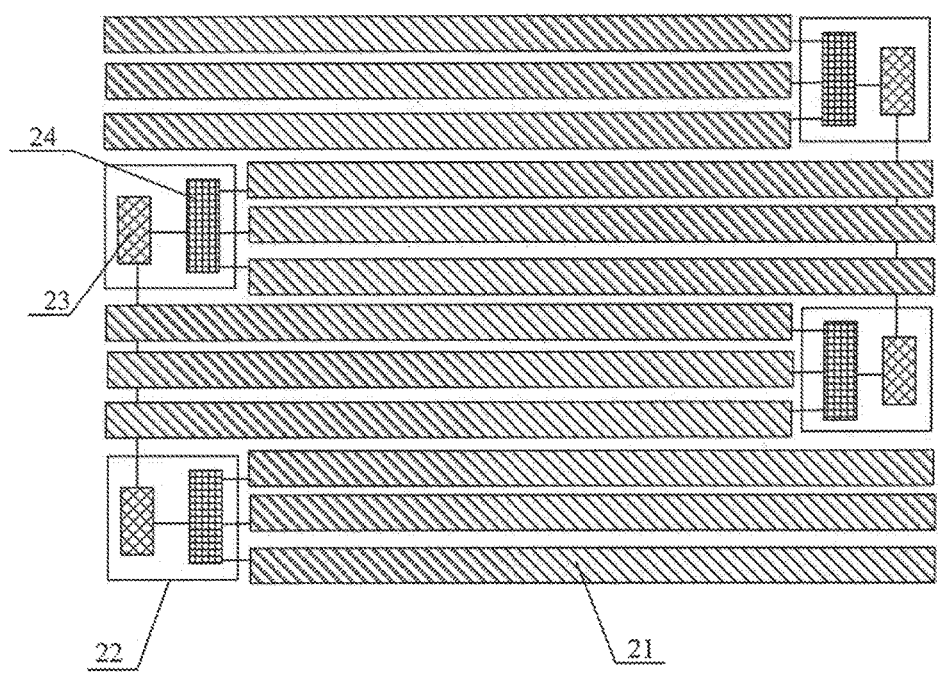
FIG. 6B is a schematic top view of the fourth array substrate where n equals 3, according to embodiments of the disclosure.

FIG. 6B is a schematic top view of the fourth array substrate where n equals 3, according to embodiments of the disclosure. As shown in FIG. 6B, in embodiments, each pixel unit group includes three rows of pixel units 21. In embodiments, the driving circuit 22 includes one shift register unit 23 and a controlling unit (e.g. a multipath controlling unit or one-to-multiple controlling unit) 24, which are disposed at the same side of the three rows of pixel units 21 in the pixel unit group. The driving circuits for neighboring pixel unit groups are disposed at different sides. In embodiments, the shift register units are cascaded in the same manner as described in FIG. 6A, and the pixel units are driven in the same manner in operation as described in FIG. 6A, thus the description will not be repeated here.

Figure 7A:
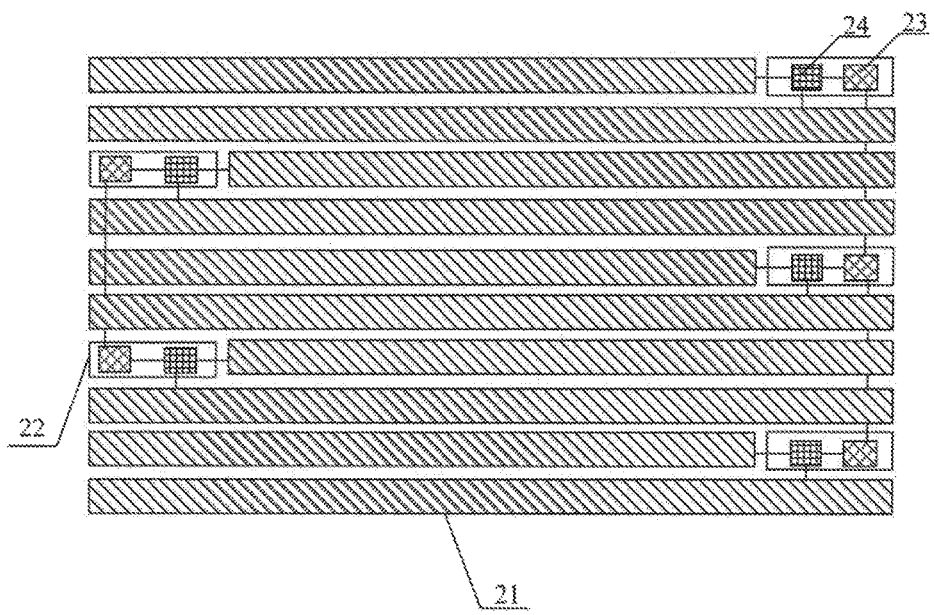
FIG. 7A is a schematic top view of a fifth array substrate where n equals 2, according to embodiments of the disclosure.

For the second implementation manner, FIG. 7A is a schematic top view of a fifth array substrate where n equals 2, according to embodiments of the disclosure. As shown in FIG. 7A, in embodiments, each pixel unit group includes two rows of pixel units 21. In embodiments, the driving circuit 22 includes one shift register unit 23 and a controlling unit 24, which are disposed at one side of the first row of pixel units 21 within the pixel unit group. The driving circuits for neighboring pixel unit groups are disposed at different sides. In embodiments, the shift register units 23 at the same side can be cascaded in sequence in the column direction to form two columns of shift register units 23 disposed on the left side and the right side of pixel units 21, respectively. That is, each shift register unit is connected to a shift register unit in a driving circuit corresponding to the second preceding pixel unit group, if any, and connected to a shift register unit in a driving circuit corresponding to the second succeeding pixel unit group. In operation, the cascaded shift register units receive driving signals in sequence according to a time sequence control signal. Within each pixel unit group, the shift register unit is configured to apply the driving signal to each row of pixel units in the pixel unit group simultaneously through the controlling unit, or alternatively, in some embodiments, apply the driving signal to each row of pixel units in the pixel unit group in sequence in the column direction in a time-division manner.

Figure 7B:
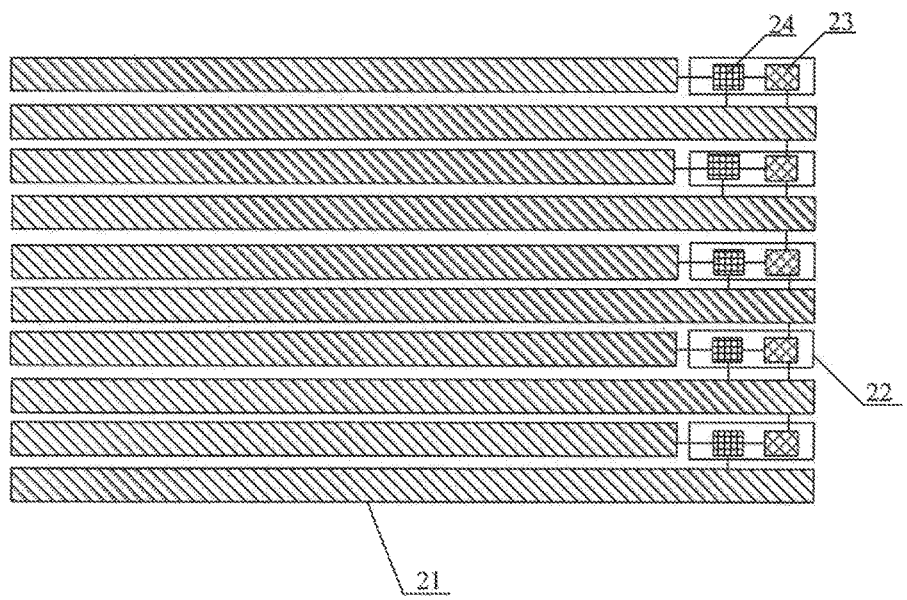
FIG. 7B is a schematic top view of a sixth array substrate where n equals 2, according to embodiments of the disclosure.

FIG. 7B is a schematic top view of a sixth array substrate where n equals 2, according to embodiments of the disclosure. As shown in FIG. 7B, these embodiments are different from the embodiments of FIG. 7A in that driving circuits for neighboring pixel unit groups are disposed at the same side. In embodiments, shift register units 23 at the same side can be cascaded in sequence in the column direction to form one column of cascaded shift register units 23 on a left or right side of pixel units 21. That is, each shift register unit is connected to a shift register unit in a driving circuit corresponding to the immediately preceding pixel unit group, and connected to a shift register unit in a driving circuit corresponding to the immediately succeeding pixel unit group. In operation, the cascaded shift register units receive driving signals in sequence according to a time sequence control signal. Within each pixel unit group, the shift register unit is configured to apply the driving signal to each row of pixel units in the pixel unit group simultaneously through the controlling unit, or alternatively, in some embodiments, apply the driving signal to each row of pixel units in the pixel unit group in sequence in the column direction in a time-division manner. Although the driving circuits are shown in FIG. 7B to be disposed at the right side, the driving circuits can alternatively be disposed at the left side of the pixel units.

Figure 7C:
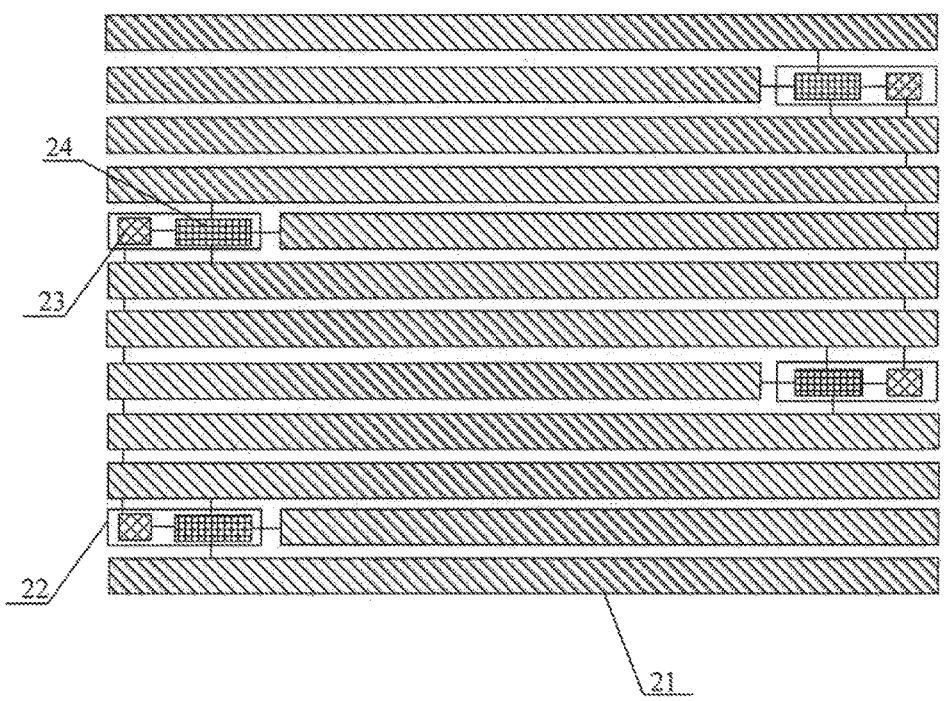
FIG. 7C is a schematic top view of the fifth array substrate where n equals 3, according to embodiments of the disclosure.

FIG. 7C is a schematic top view of the fifth array substrate where n equals 3, according to embodiments of the disclosure. As shown in FIG. 7C, in embodiments, each pixel unit group includes three rows of pixel units 21. In embodiments, the driving circuit 22 includes one shift register unit 23 and a controlling unit 24, which are disposed at one side of one row of pixel units 21 in the pixel unit group. The driving circuits for neighboring pixel unit groups are disposed at different sides. In embodiments, the shift register units are cascaded in the same manner as described in FIG. 7A; and pixel units are driven in the same manner in operation as described in FIG. 7A, thus the description will not be repeated here.

Figure 7D:
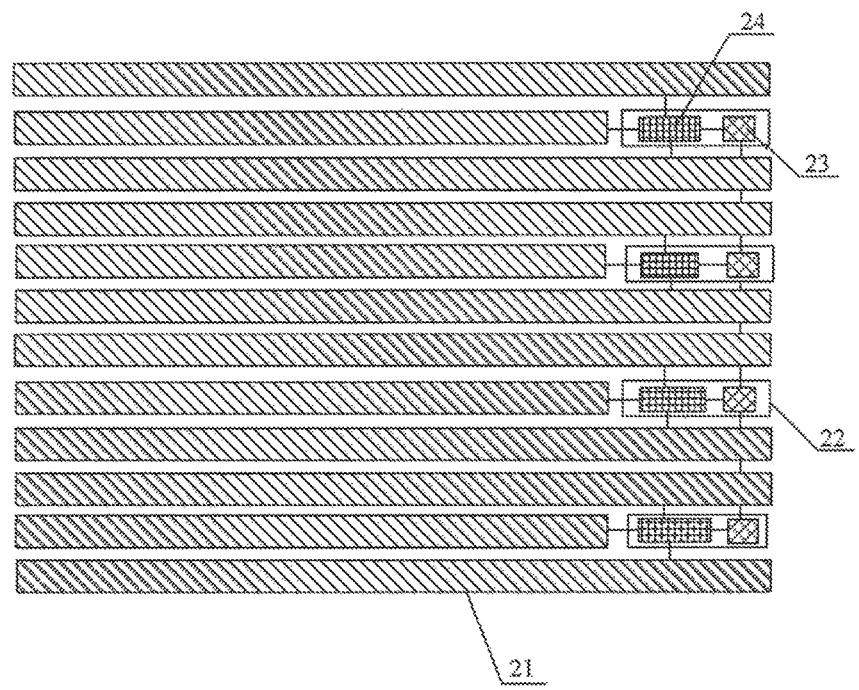
FIG. 7D is a schematic top view of the sixth array substrate where n equals 3, according to embodiments of the disclosure.

FIG. 7D is a schematic top view of the sixth array substrate where n equals 3, according to embodiments of the disclosure. As shown in FIG. 7D, in embodiments, each pixel unit group includes three rows of pixel units 21. In embodiments, the driving circuit 22 includes one shift register unit 23 and a controlling unit 24, which are disposed at one side of one of the three rows of pixel units 21 in the pixel unit group. The driving circuits for neighboring pixel unit groups are disposed at the same side. In embodiments, the shift register units are cascaded in the same manner as described in FIG. 7B; and pixel units are driven in the same manner in operation as described in FIG. 7B, thus the description will not be repeated here. Although the driving circuits 22 are shown in FIG. 7D to be disposed at the right side, the driving circuits 22 can alternatively be disposed at the left side of the pixel units.

Figure 8:
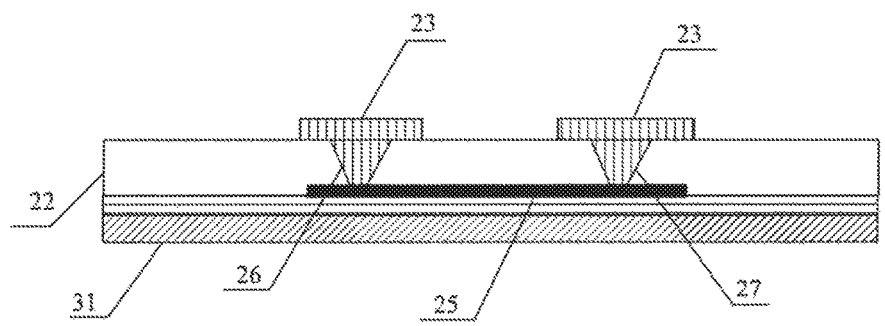
FIG. 8 is a schematic connection view showing connections of shift register units, according to embodiments of the disclosure.

In embodiments shown in FIGS. 4A to 7D, the shift register units at the same side are cascaded. FIG. 8 is a schematic connection view showing connections of shift register units, according to embodiments of the disclosure. As shown in FIG. 8, the shift register units 23 at the same side are connected through a metal wire 25, e.g., a first terminal of the metal wire 25 is electrically connected to one of two adjacent shift register units 23 through a first through hole 26, and a second terminal of the metal wire 25 is electrically connected to the other of the two adjacent shift register units 23 through a second through hole 27.

Additionally, in embodiments shown in FIGS. 4A to 7D, an idle area at one side of a row of pixel units is reserved to accommodate the driving circuit 22. Therefore, the driving circuit is covered by a partial area of at least one of preceding and succeeding pixel units 21 neighboring to the driving circuit 22 in the column direction of the pixel units.

Figure 9A:
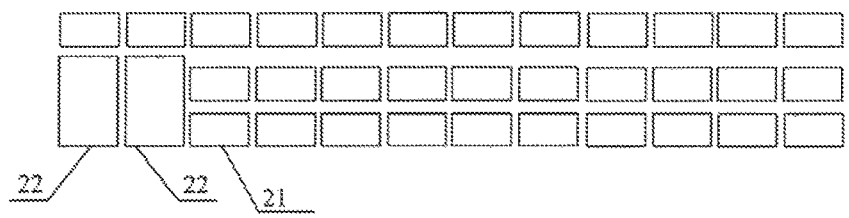
FIG. 9A is a schematic top view of the second array substrate, according to embodiments of the disclosure.

FIG. 9A is a schematic top view of the second array substrate, according to embodiments of the disclosure. As shown in FIG. 9A, in the column direction of the pixel units 21, the driving circuit 22 is covered by a partial area of m pixel units in a succeeding row of pixel units neighboring to the driving circuit 22, where m is a positive integer equal to or larger than 1.

Figure 9B:
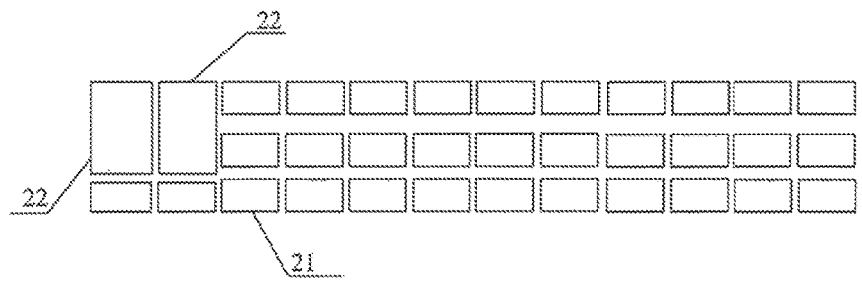
FIG. 9B is a schematic top view of the third array substrate, according to embodiments of the disclosure.

FIG. 9B is a schematic top view of the third array substrate, according to embodiments of the disclosure. As shown in FIG. 9B, in the column direction of the pixel units 21, the driving circuit 22 is covered by a partial area of m pixel units in a preceding row of pixel units neighboring to the driving circuit 22, where m is a positive integer equal to or larger than 1.

Figure 9C:
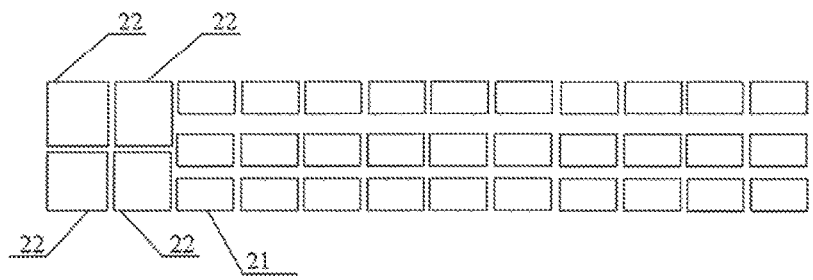
FIG. 9C is a schematic top view of the fourth array substrate, according to embodiments of the disclosure.

FIG. 9C is a schematic top view of the fourth array substrate, according to embodiments of the disclosure. As shown in FIG. 9C, in the column direction of pixel units, the driving circuit 22 is covered by a partial area of m pixel units in a preceding row of pixel units neighboring to the driving circuit and a partial area of m pixel units in a succeeding row of pixel units neighboring to the driving circuit, where m is a positive integer equal to or larger than 1.

In embodiments described in combination with FIGS. 9A, 9B and 9C, m is exemplarily described as being equal to 2. However, a value of m is depends on a specific size of the driving circuit in the row direction of pixel units in a practical application.

The array substrate provided in embodiments of the disclosure achieves the interleaving arrangement of the driving circuits with the various pixel unit groups in various manners, so that the display area interlaces with the peripheral circuit area, and displaying is performed on the entire area of the display panel in operation, thereby obtaining a frameless display effect.

Embodiments of the disclosure further provide a liquid crystal display panel, including the array substrate described in any of the above embodiments.

Figure 10A:
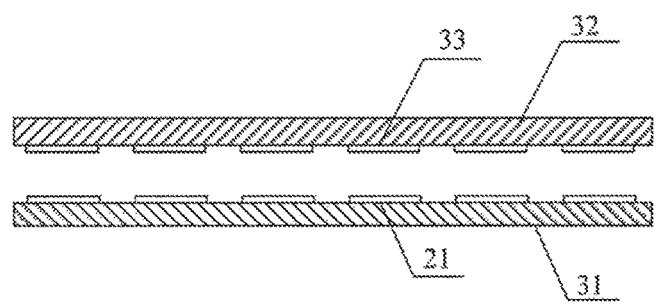
FIG. 10A is a schematic structural view of a liquid crystal display panel, according to embodiments of the disclosure.
Figure 10B:
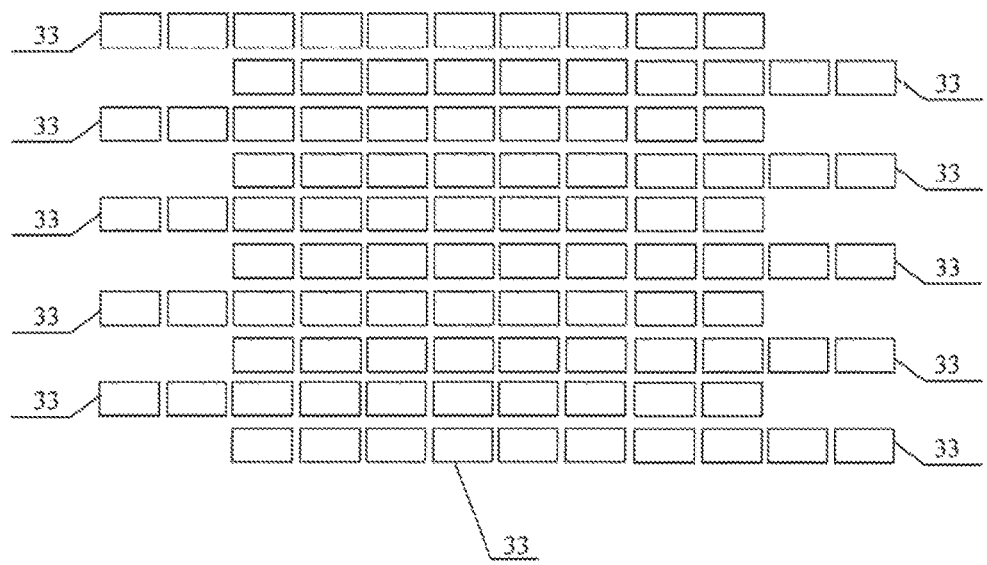
FIG. 10B is a schematic top view of a color filter substrate, according to embodiments of the disclosure.

FIG. 10A is a schematic structural view of a liquid crystal display panel, according to embodiments of the disclosure. As shown in FIG. 10A, the liquid crystal display panel includes an array substrate 31 on which pixel units 21 are disposed, and a color filter substrate 32 on which color filters 33 corresponding respectively to the pixel units 21 on the array substrate 31 are disposed. FIG. 10B is a schematic top view of a color filter substrate, according to embodiments of the disclosure. The arrangement of the color filters 33 on the color filter substrate shown in FIG. 10B corresponds to that of the pixel units 21 and the driving circuits 22 on the array substrate shown in FIG. 2. Also, in some embodiments, other arrangements of the color filters corresponding to other arrangements of the pixel units and the driving circuits on the array substrate are possible.

Figure 11A:
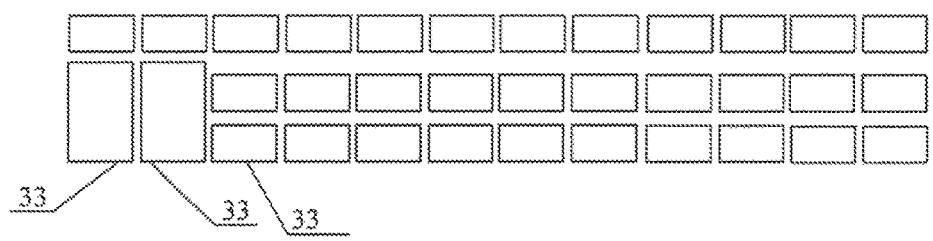
FIGS. 11A to 11C are schematic top views of another color filter substrate, according to embodiments of the disclosure.
Figure 11B:
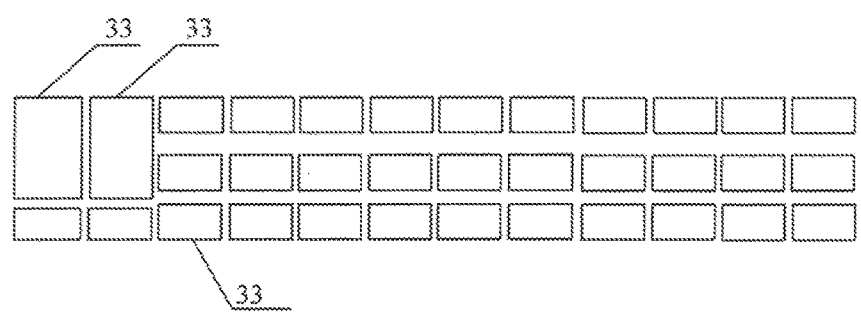
Figure 11C:
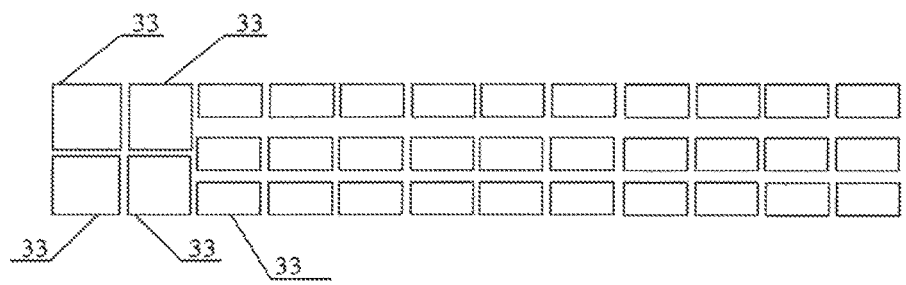

Additionally, FIGS. 11A to 11C are schematic top views of another color filter substrate, according to embodiments of the disclosure. Corresponding to the technical solutions shown in FIGS. 9A-9C in which the driving circuit 22 is covered by a partial area of at least one of the preceding and succeeding pixel units 21 neighboring to the driving circuit 22 in the column direction of the pixel units, color filters 33 corresponding respectively to pixel units 21 with portions covering the driving circuit 22 are disposed on the color filter substrate, according to embodiments of the disclosure. As shown in FIGS. 9A to 9C, a plurality of color filters 33 at the same row are not identified individually. However, it can be understood by those skilled in the art that each row of color filters may include a plurality of individual color filters 33.

In the liquid crystal display panel, according to embodiments of the disclosure, the driving circuits are hidden among pixel units through interleaving of the driving circuits with the neighboring preceding and succeeding pixel units in the column direction of the pixel units on the array substrate, that is, the display area interlaces with the peripheral circuit area, instead of separately arranging the driving circuits outside the display area formed by the pixel units. As such, displaying is performed on the entire area of the display panel in operation to achieve a frameless display effect.

Figure 12A:
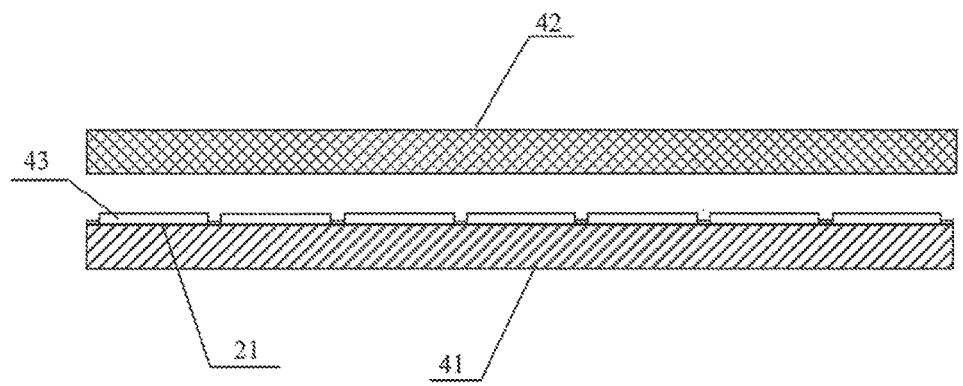
FIG. 12A is a schematic sectional view of an organic light emitting display panel, according to embodiments of the disclosure.

Embodiments of the disclosure further provide an organic light emitting display panel including the array substrate described in any of the above embodiments. FIG. 12A is a schematic sectional view of an organic light emitting display panel, according to embodiments of the disclosure. As shown in FIG. 12A, the organic light emitting display panel includes an array substrate 41 and an encapsulating substrate 42 disposed opposite to the array substrate 41. Additionally, an organic light emitting layer 43 is disposed on pixel units 21 on the array substrate 41.

Figure 12B:
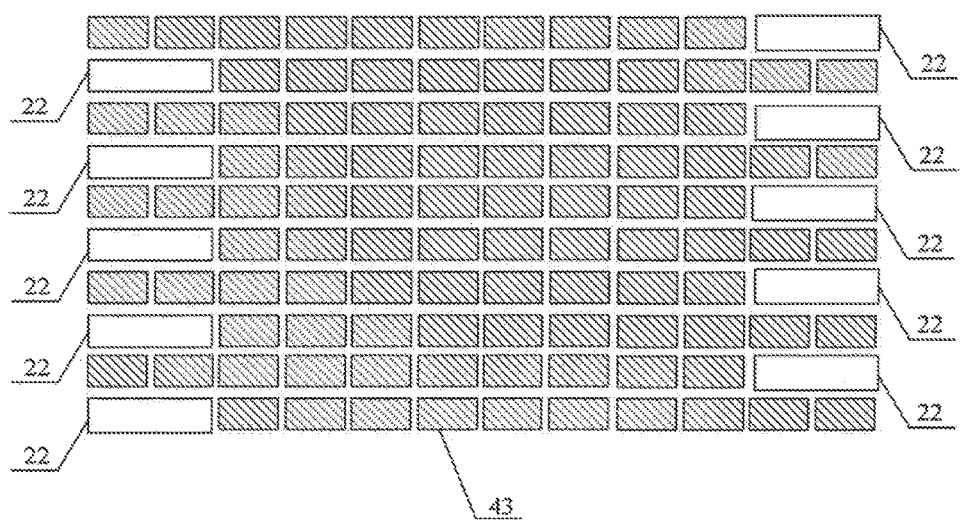
FIG. 12B is a schematic top view of an array substrate adopted in an organic light emitting display panel, according to embodiments of the disclosure.

FIG. 12B is a schematic top view of an array substrate adopted in an organic light emitting display panel, according to embodiments of the disclosure, where an organic light emitting layer 43 is disposed above pixel units of the array substrate. As shown in FIG. 12B, corresponding to the arrangement of the pixel units 21 and the driving circuits 22 on the array substrate as shown in FIG. 2, the organic light emitting layer 43 is disposed on the array substrate. Also, in some embodiments, other arrangements of the organic light emitting layer 43 on the array substrate in a manner corresponding to other arrangements of pixel units and driving circuits are possible.

Figure 12C:
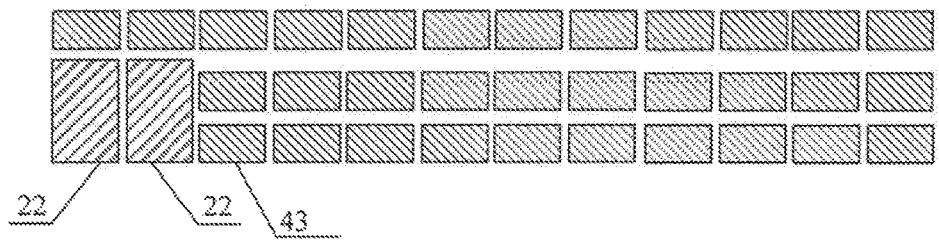
FIGS. 12C to 12E are schematic top views of another array substrate adopted in an organic light emitting display panel, according to embodiments of the disclosure.
Figure 12D:
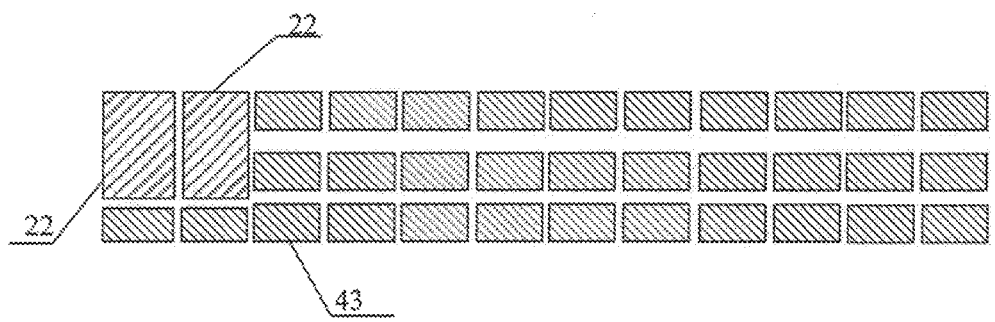
Figure 12E:
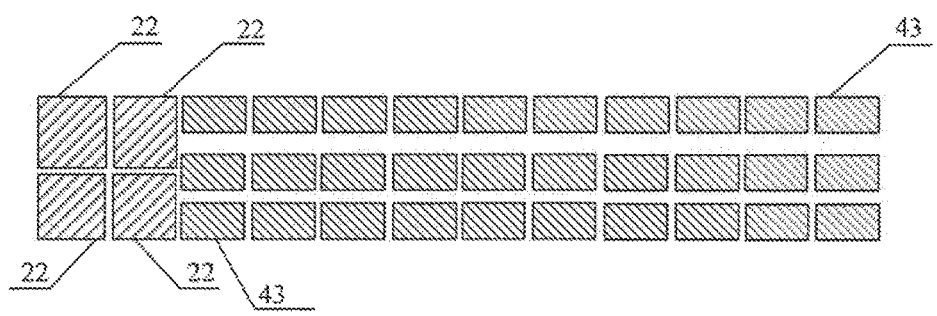

Additionally, corresponding to the technical solution in which the driving circuit 22 is covered by a partial area of at least one of the preceding and succeeding pixel units 21 neighboring to the driving circuit 22 in the column direction of the pixel units as shown in FIGS. 9A to 9C, an organic light emitting layer 43 is disposed on the pixel unit with portions covering the driving circuit. FIGS. 12C to 12E are schematic top views of another array substrate adopted in an organic light emitting display panel, according to embodiments of the disclosure, corresponding to FIGS. 9A to 9C. As shown in FIGS. 12C to 12E, an organic light emitting layer 43 is disposed on the pixel units 21 of the array substrate. To cover the driving circuit, some of the pixel units 21 as shown have an increased size in the column direction of the pixel units, and accordingly the size of the organic light emitting layer 43 is increased as well.

In the organic light emitting display panel, according to embodiments of the disclosure, the driving circuits are hidden among pixel units through interleaving of the driving circuits with the neighboring preceding and succeeding pixel units in the column direction of pixel units on the array substrate, that is, the display area interlaces with the peripheral circuit area, instead of separately arranging the driving circuits outside the display area formed by the pixel units. As such, displaying is performed on the entire area of the display panel in operation to achieve a frameless display effect.

Some embodiments and the applied technology principles of the disclosure have been described as above. It should be understood for those skilled in the art that the disclosure is not limited to particular embodiments described herein. Various apparent modifications, adjustment and substitutions can be made by those skilled in the art without departing from the scope of protection of the disclosure. Therefore, although the disclosure is illustrated in detail through the above embodiments, the disclosure is not merely limited to the above embodiments, and can further include more other embodiments without departing the concept of the disclosure.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

I claim:

1. An array substrate, comprising:
   a plurality of pixel units arranged in a plurality of rows and a plurality of columns and divided into a plurality of pixel unit groups, wherein each of the plurality of pixel unit groups comprises n rows of pixel units, wherein n is equal to or larger than 1; and
   at least one driving circuit, each of the at least one driving circuit is disposed on a side of the pixel unit group in a row direction;
   wherein the at least one driving circuit interleaves with and covers neighboring preceding and succeeding pixel unit groups in a column direction of the plurality of pixel units,
   wherein, when n is equal to or larger than 2, each driving circuit of the at least one driving circuit comprises a shift register unit and a one-to-multiple row controlling unit, each row of pixel units in the pixel unit group is connected to the shift register unit through the one-to-multiple row controlling unit, in operation, the shift register unit is configured to apply a driving signal to the each row of pixel units in the pixel unit group simultaneously through the one-to-multiple row controlling unit, wherein the driving circuit is disposed on one side and in a row of the n rows of pixel units within the pixel unit group, and the driving circuits for neighboring pixel unit groups are disposed at different sides.

2. The array substrate of claim 1, wherein shift register units for neighboring pixel unit groups are disposed at different sides.

3. The array substrate of claim 1, wherein the shift register units disposed at the same side are sequentially connected through metal wires, with a first terminal of the metal wire being electrically connected to one of adjacent shift register units through a first through hole, and a second terminal of the metal wire being electrically connected to the other of the adjacent shift register units through a second through hole.

4. The array substrate of claim 1, wherein the driving circuit is covered by a partial area of at least one of the pixel units neighboring to the driving circuit in the column direction of the plurality of pixel units.

5. A liquid crystal display panel, comprising an array substrate which comprises:
   a plurality of pixel units arranged in a plurality of rows and a plurality of columns and divided into a plurality of pixel unit groups, wherein each of the plurality of pixel unit groups comprises n rows of pixel units, wherein n is equal to or larger than 1; and
   at least one driving circuit, each of the at least one driving circuit is disposed on a side of the pixel unit group in a row direction;
   wherein the at least one driving circuit interleaves with and covers neighboring preceding and succeeding pixel unit groups in a column direction of the plurality of pixel units,
   wherein, when n is equal to or larger than 2, each driving circuit of the at least one driving circuit comprises a shift register unit and a one-to-multiple row controlling unit, each row of pixel units in the pixel unit group is connected to the shift register unit through the one-to-multiple row controlling unit, in operation, the shift register unit is configured to apply a driving signal to the each row of pixel units in the pixel unit group simultaneously through the one-to-multiple row controlling unit, wherein the driving circuit is disposed on one side and in a row of the n rows of pixel units within the pixel unit group, and the driving circuits for neighboring pixel unit groups are disposed at different sides.

6. The liquid crystal display panel of claim 5, further comprising a color filter substrate, on which color filters corresponding respectively to the pixel units on the array substrate are disposed.

7. The liquid crystal display panel of claim 6, wherein the color filter corresponding to a pixel unit with a portion covering the driving circuit is disposed on the color filter substrate.

8. An organic light emitting display panel, comprising an array substrate which comprises:
   a plurality of pixel units arranged in a plurality of rows and a plurality of columns and divided into a plurality of pixel unit groups, wherein each of the plurality of pixel unit groups comprises n rows of pixel units, wherein n is equal to or larger than 1; and
   at least one driving circuit, each of the at least one driving circuit is disposed on a side of the pixel unit group in a row direction;
   wherein the at least one driving circuit interleaves with and covers neighboring preceding and succeeding pixel unit groups in a column direction of the plurality of pixel units,
   wherein, when n is equal to or larger than 2, wherein each driving circuit of the at least one driving circuit comprises a shift register unit and a one-to-multiple row controlling unit, each row of pixel units in the pixel unit group is connected to the shift register unit through the one-to-multiple row controlling unit, in operation, the shift register unit is configured to apply a driving signal to the each row of pixel units in the pixel unit group simultaneously through the one-to-multiple row controlling unit, wherein the driving circuit is disposed on one side and in a row of the n rows of pixel units within the pixel unit group, and the driving circuits for neighboring pixel unit groups are disposed at different sides.

9. The organic light emitting display panel of claim 8, wherein an organic light emitting layer is provided on pixel units of the array substrate.

10. The organic light emitting display panel of claim 9, wherein an organic light emitting layer is provided on a pixel unit with a portion covering the driving circuit.

11. The organic light emitting display panel of claim 8, further comprising an encapsulating substrate disposed opposite to the array substrate.

\* \* \* \* \*